INVENTOR
LAUREL R. LIND
BY Jeffers and Young
ATTORNEYS

INVENTOR
LAUREL R. LIND
BY Jeffers and Young
ATTORNEYS

INVENTOR
LAUREL R. LIND
BY Jeffers and Young
ATTORNEYS 3,541,451

VARIABLE CENTER FREQUENCY FILTER FOR FREQUENCY MODULATION RECEIVER

Laurel R. Lind, Auburn, Ind., assignor to The Magnavox Company, Fort Wayne, Ind., a corporation of Delaware Filed Dec. 26, 1967, Ser. No. 693,448
Int. Cl. H04b *1/10*
U.S. Cl. 325—346 9 Claims

ABSTRACT OF THE DISCLOSURE

A narrow passband, variable center frequency filter is connected in the circuit of a conventional frequency modulation receiver between the receiver mixer and the amplitude limiter. The center frequency of the filter is varied by a voltage signal derived from the output of the receiver demodulator so that the passband of the filter is centered on the intermediate frequency being received.

CROSS REFERENCE TO RELATED APPLICATIONS

This invention is an improved arrangement over that taught and disclosed in U.S. Pat. No. 2,976,408 granted to A. C. Colaguori on Mar. 21, 1961.

BACKGROUND OF THE INVENTION

My invention relates to a variable center frequency filter for frequency modulation receivers, and particularly to an improved arrangement for such a filter.

Frequency modulation (FM) broadcasting is increasing in use and popularity. With the increased number of FM radio broadcasting stations, it is possible, in spite of FCC frequency assignments, for a sensitive FM receiver to receive an interfering signal relatively close in frequency to the desired FM signal. This condition may cause interference and annoyance to a listener, particularly a discriminating listener of stereo FM broadcasts. In addition to broadcasting, FM is used in communication applications, particularly the transportation industry. In these communication applications, the large number of FM stations, the relatively small allotted bands, and the operating conditions combine to produce noise which interferes with and degrades the desired signal.

Accordingly, an object of my invention is to provide an improved filter circuit for a frequency modulation receiver.

Another object of my invention is to provide a narrow passband, variable center frequency filter for use in an FM receiver in order to improve the discrimination and signal-to-noise ratio of the receiver.

Another object of my invention is to provide an improved FM receiver having a variable center frequency filter for providing improved communication.

Pat. No. 2,976,408 mentioned above provides a variable center frequency filter arrangement for FM receivers. However, the arrangement of that patent is relatively complex. That arrangement utilizes a control signal derived from a phase comparator which is added to the normal circuits already present in a conventional FM receiver. While the arrangement shown in the patent apparently operates satisfactorily, the arrangement is undesirable since it requires the addition of a phase comparator. Any additional circuit complicates an FM receiver, makes the receiver more difficult to reliably construct, and makes the receiver more expensive.

Accordingly, another object of my invention is to provide a narrow passband, variable center frequency filter for an FM receiver that does not require additional circuits other than the filter itself.

Another object of my invention is to provide a variable center frequency filter which can be controlled by signals available in a conventional FM receiver.

SUMMARY OF THE INVENTION

Briefly, these and other objects are achieved in accordance with my invention by a variable center frequency filter which is preferably inserted in an FM receiver circuit between the mixer stage and the intermediate frequency amplifier stage or stages. This variable center frequency filter has a relatively narrow passband, for example in the order of 80 kilocycles at the 6 db points, and includes frequency determining components whose magnitudes can be varied by a control signal. This control signal is derived from the output of the demodulator in the FM receiver, and sets the center frequency of the narrow passband filter at the center of the intermediate frequency signal then being provided by the mixer. The narrow passband, variable center frequency filter improves the signal-to-noise ratio and other operating characteristics of the FM receiver, and is easily and simply controlled by a signal provided by the demodulator in a conventional FM receiver.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1A:
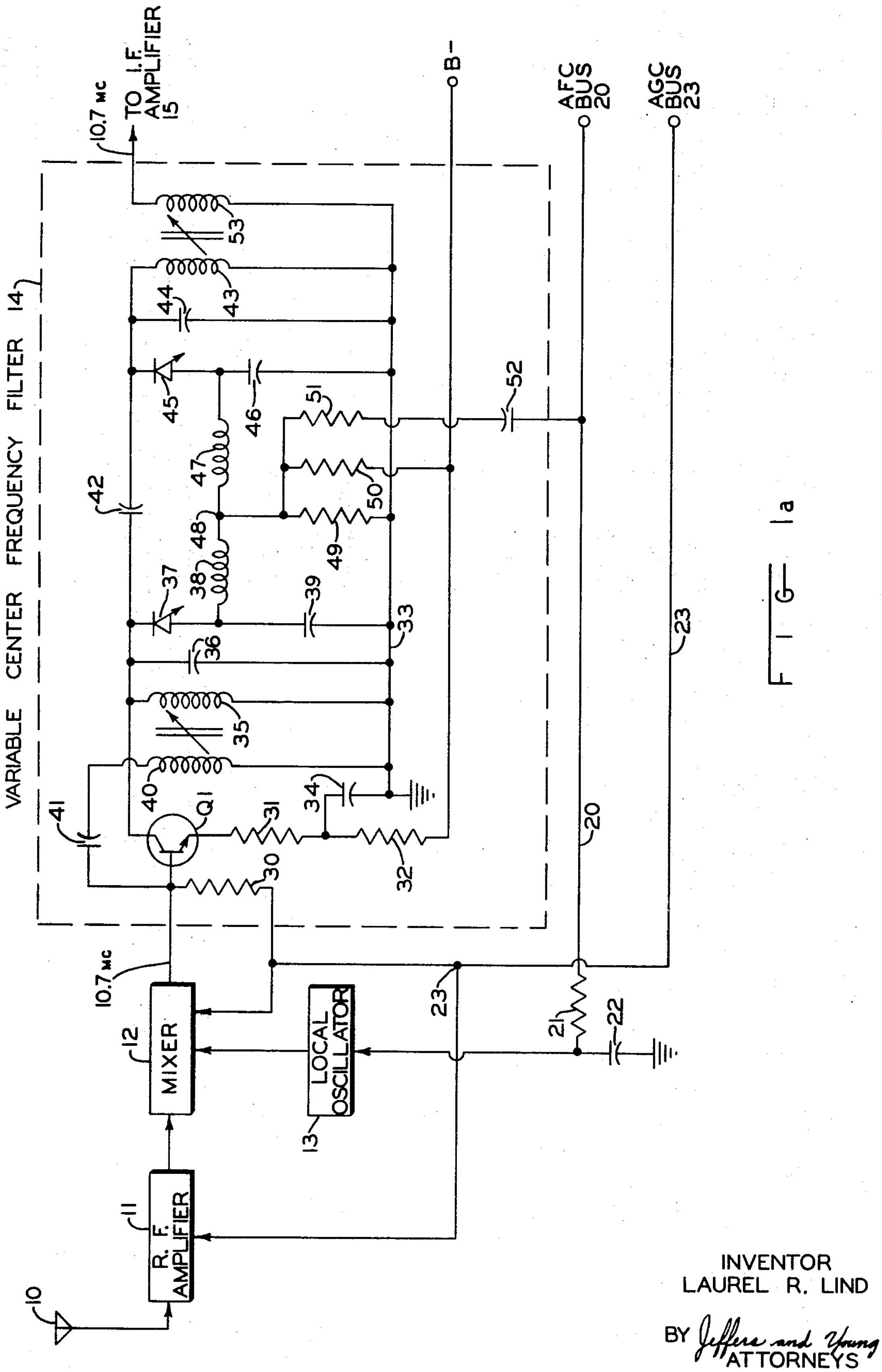
FIG. 1*a* and 1*b* show a combined schematic and block diagram of a preferred embodiment of an FM receiver utilizing a variable center frequency filter in accordance with my invention.
Figure 1B:
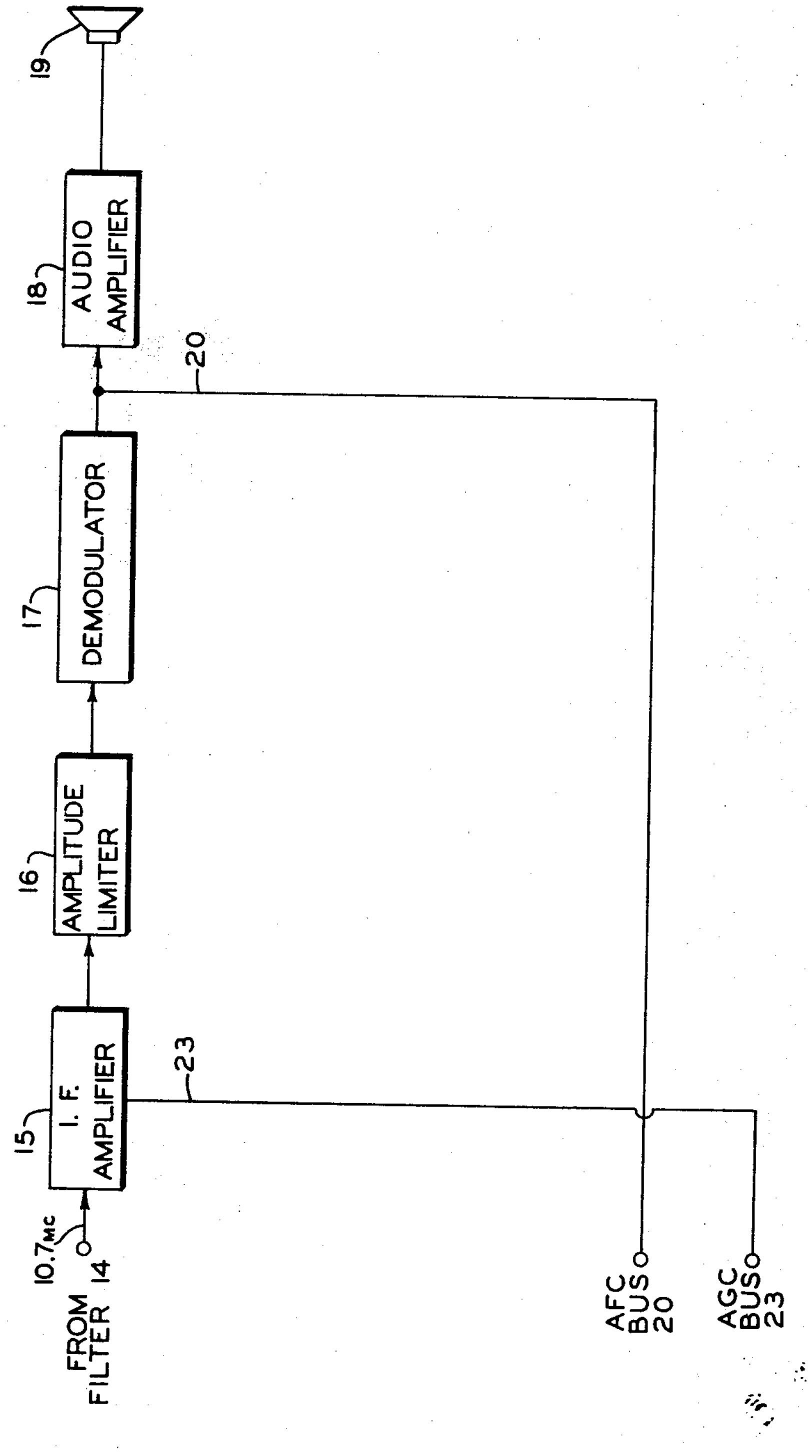

With reference to FIG. 1*a* and 1*b*, I have shown a block diagram of a conventional FM receiver and a schematic diagram of a variable center frequency filter constructed and connected in the receiver in accordance with my invention. The diagram is to be considered as a unit, with the right portion of FIG. 1*a* being connected to the left portion of FIG. 1*b*. The receiver includes a signal source such as an antenna 10 which is coupled to a radio frequency (RF) amplifier 11 having one or more stages of amplification. The output of the RF amplifier 11 is applied to a mixer stage 12 which heterodynes or mixes the incoming RF signals with a signal produced in the receiver by a local oscillator 13. The mixer 12 produces an intermediate frequency (IF) signal which, in the embodiment illustrated, is assumed to be 10.7 megacycles (mc.). This signal is applied to a variable center frequency filter 14 which is shown in complete schematic form, and enclosed by dashed lines. The output of the variable center frequency filter 14 is applied to an intermediate frequency (IF) amplifier 15 which may also include one or more stages of amplification. The output of the IF amplifier 15 is applied to an amplitude limiter 16 which limits the amplitude of the IF signal. The output of the amplitude limiter 16 is applied to a demodulator 17 which produces an audio frequency signal. This audio frequency signal is applied to an audio amplifier 18 which may also include one or more stages of amplification. The amplified audio frequency signals are applied to a loud speaker 19 or other sound utilizing device. The audio frequency signals supplied by the demodulator 17 are also applied to an automatic frequency control (AFC) bus 20. In a conventional FM receiver, signals on the AFC bus 20 are applied through a suitable resistor 21, which is shunted by a capacitor 22 to a point of reference potential or ground, to the local oscillator 13 to stabilize and correct the frequency of the local oscillator 13. Also in a conventional FM receiver, an automatic gain control (AGC) bus 23 is connected to the IF amplifier 15 to supply AGC signals to the RF amplifier 11, to the mixer 12, and to the variable center frequency filter 14. Aside from the variable center frequency filter 14 and its connections in the FM receiver, the circuit as shown and described thus far is a conventional FM receiver circuit that operates in conventional fashion.

With respect to the variable center frequency filter 14 of my invention, this filter 14 is preferably inserted in the intermediate frequency portion of the receiver. In the embodiment shown, the filter 14 is placed between the mixer 12 and the IF amplifier 15. However, my filter 14 can also be inserted at other places in the receiver, for example between two stages in the IF amplifier 15, or between the IF amplifier 15 and the amplitude limiter 16. My filter 14 comprises a suitable amplifying device, such as the NPN type transistor Q1. The base electrode of the transistor Q1 is connected to the output of the mixer 12. The base of the transistor Q1 is also connected through a resistor 30 to the AGC bus 23. The emitter of the transistor Q1 is connected through two serially connected resistors 31, 32 to a terminal B- which is supplied with a source of direct current potential that is negative with respect to a point of reference potential or ground. This reference potential or ground is provided by a ground bus 33. The junction of the resistors 31, 32 is coupled through a capacitor 34 to the ground bus 33. The collector of the transistor Q1 is coupled to a first tuned filter stage comprising a variable inductor 35 and a capacitor 36 which are coupled in parallel between the collector and the ground bus 33. A voltage sensitive capacitor 37, schematically shown as a diode with an arrow, is coupled in parallel or shunt with the capacitor 36 through a capacitor 39. The transistor Q1 is neutralized by a circuit having a capacitor 41 connected between the base of the transistor Q1 and one end of an inductor 40 which is closely coupled to the inductor 35. The other end of the inductor 40 is connected to the ground bus. The output of the first tuned filter stage is coupled through a coupling capacitor 42 to a second tuned filter stage comprising a variable inductor 43 and a capacitor 44 which are coupled in parallel between the capacitor 42 and the ground bus 33. A voltage sensitive capacitor 45 is coupled in parallel or shunt with the capacitor 44 through a capacitor 46.

The voltage sensitive capacitors 37, 45 in the two tuned circuits have a capacity which varies as a function of a voltage applied to their anodes. A common voltage for both capacitors 37, 45 is derived from the AFC bus 20 through an isolating capacitor 52 and a resistor 51 connected to a common junction point 48. Choke inductors 38, 47 are respectively connected between the point 48 and the capacitors 37, 45. The junction point 48 is also coupled through a resistor 49 to the ground bus 33, and through a resistor 50 to the B- terminal. An inductor 53 is closely coupled to the variable inductor 43 to connect the output of the filter 14 to the IF amplifier 15.

The exact center frequency provided by the variable center frequency filter 14 is determined by the signal supplied by the AFC bus 20 to the voltage sensitive capacitors 37, 45. The amount of capacity of the capacitors 37, 45 is determined by the signal magnitude supplied to them from the AFC bus 20. As the signal magnitude increases, the capacity of the capacitors 37, 45 decreases so that the center frequency of the filter 14 increases. Conversely, as the signal magnitude decreases, the capacity of the capacitors 37, 45 increases so that the center frequency of the filter 14 decreases. Thus, the magnitude of the demodulated or audio signal on the AFC bus 20 serves to shift the center frequency of the filter 14 so that its passband is centered at a point synchronized with the instantaneous intermediate frequency. If this passband is relatively narrow, noise and other adjacent frequency signals will be reduced so that the signal-to-noise ratio of the receiver is increased. In the diagram shown, it will be seen that the necessary control signal derived from the AFC bus 20 is already provided by or present in a conventional FM receiver, so that the only needed additional element or circuit is the variable center frequency filter 14. The added complexities of phase shifting circuits and phase comparator circuits, such as shown in Pat. No. 2,976,408, are eliminated. Thus, my invention provides an improved FM receiver that is relatively simple to construct and adjust.

Figure 2:
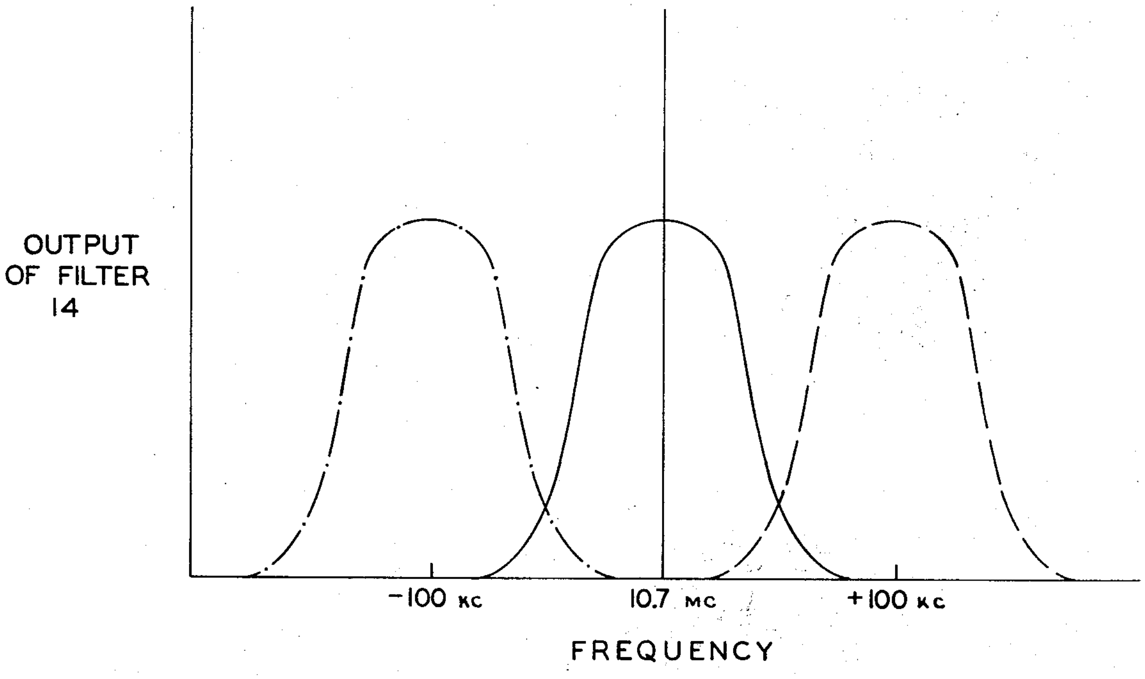
FIG. 2 shows curves illustrating the operation of my invention.

FIG. 2 shows curves which illustrate the operation of the variable center frequency filter 14 in the receiver of FIGS. 1*a* and 1*b*. In FIG. 2, it has been assumed that the receiver intermediate frequency has a nominal or center frequency of 10.7 megacycles. The response of the filter 14 at this center frequency is shown by the solid line curve. As the magnitude of the audio signal on the AFC bus 20 increases, the center frequency of the filter 14 increases or moves so that the passband is centered at some point such as 10.7 megacycles plus 100 kilocycles (kc.). This response is shown by the dashed line curve. As the magnitude of the audio on the AFC bus 20 decreases, the center frequency of the filter 14 decreases or moves so that the passband is centered at some point such as 10.7 megacycles minus 100 kilocycles (kc.). This response is shown by the dashed and dotted line curve. In FIG. 2, it will be seen that the passband response of the filter 14 is thus shifted about the center intermediate frequency of 10.7 megacycles to provide a variable center of frequency filter that improves the operation and signal-to-noise ratio of an FM receiver utilizing my invention.

An FM receiver utilizing a variable center frequency filter 14 such as shown in FIGS. 1*a* and 1*b* has been built and constructed. This receiver had a center intermediate frequency of 10.7 megacycles, the first tuned stage had a center frequency of 10.7 megacycles, and the second tuned stage had a center frequency of 10.7 megacycles. The components of the filter 14 had the following values:

| | |
|---|---|
| Transistor **Q1** | Magnavox type 4IN2. |
| Resistors: | |
| **30** | 3,900 ohms. |
| **31** | 47 ohms. |
| **32** | 47 ohms. |
| Capacitor **34** | 0.01 mfd. |
| Inductor **35** | 0.7 to 1.3 microhenries. |
| Capacitor **36** | 180 pfd. |
| Variable capacitor **37** | Motorola Type MV 1403. |
| Inductor **38** | 100 microhenries. |
| Capacitor **39** | 180 pfd. |
| Inductor **40** | 0.45 microhenries. |
| Capacitors: | |
| **41** | 0.82 pfd. |
| **42** | 0.68 pfd. |
| Inductor **43** | 0.7 to 1.3 microhenries. |
| Capacitor **44** | 220 pfd. |
| Variable capacitor **45** | Motorola Type MV 1403. |
| Capacitor **46** | 180 pfd. |
| Inductor **47** | 100 microheries. |
| Resistors: | |
| **49** | 27,000 ohms. |
| **50** | 100,000 ohms. |
| **51** | 27,000 ohms. |
| Capacitor **52** | 10 mfd. |
| Inductor **53** | 0.45 microhenries. |

This receiver was built, adjusted, and operated to provide a receiver which had an improved signal-to-noise ratio of 30 db for a 1.7 microvolt signal at the 300 ohm antenna terminals, with the signal being modulated plus and minus 22.5 kilocycles.

It will thus be seen that my invention provides a new and improved variable center frequency filter for an FM receiver, and an improved circuit for controlling this filter. This improved circuit utilizes an already available audio voltage, and provides a center frequency in the intermediate frequency stage that is variable. Persons skilled in the art will appreciate that modifications may be made to my invention. For example, the variable center frequency filter 14 may have only one tuned stage, rather than the two tuned stages shown. However, I prefer two stages, since this improves the passband characteristics of the filter 14. The filter 14 may be inserted at any suitable place in the FM receiver, such as between two stages of the IF amplifier, or between the IF amplifier and the amplitude limiter. Also, the voltage sensitive frequency determining elements may take a number of forms, such as the capacitors shown, or may be a variable inductor. Therefore, while my invention has been described with reference to a particular embodiment, it is to be understood that modifications may be made without departing from the spirit of the invention or from the scope of the claims.

What I claim as new and desire to secure by Letters Patent of the United States is:

1. In a frequency modulation receiver having a mixer, an intermediate frequency amplifier, and a demodulator system which provides an audio frequency control signal, an improved variable center frequency filter having a passband whose center frequency is shifted as a function of a control signal applied to an input, said filter being adapted to be connected in said receiver in a portion thereof where a intermediate frequency is present, the audio frequency output of said demodulator system being directly connected to said filter input for directly controlling the center frequency of said filter by the control signal from the output of said receiver demodulator.

2. An improved frequency modulation receiver comprising:

(a) a signal input circuit;
(b) a local oscillator;
(c) a mixer coupled to said signal input circuit and to said local oscillator for producing an intermediate frequency signal;
(d) a variable center frequency filter having an input, an output, and a frequency controlling element whose reactance varies as a function of an applied signal;
(e) means coupling said filter input to said mixer;
(f) an amplitude limiter coupled to said filter output;

(g) a demodulator coupled to said amplitude limiter for producing an audio frequency signal at an output of said demodulator;
(h) and means coupling said demodulator output to said frequency controlling element for applying said audio frequency signal to said frequency controlling element and varying the center frequency of said filter as a function of said audio frequency signal.

3. The improved receiver of claim 2 wherein said frequency controlling element has capacitive reactance.

4. The improved receiver of claim 3 wherein said filter comprises two tuned circuits, each having a voltage controlled frequency controlling element that has capacitive reactance.

5. The improved receiver of claim 2 wherein said frequency controlling element has inductive reactance.

6. The improved receiver of claim 5 wherein said filter comprises two tuned circuits, each having a voltage controlled frequency controlling element that has inductive reactance.

7. The improved receiver of claim 2 wherein the frequency determining element is voltage controlled.

8. The improved receiver of claim 2 wherein the frequency determining element is current controlled.

9. In a receiver having at least one tuned stage and a demodulator system which provides an audio frequency control signal, an improved variable center frequency filter having a passband whose center frequency is shifted as a function of a control signal applied to an input, said filter being adapted to be connected in a tuned stage of said receiver, the audio frequency control signal output of said demodulator system being directly connected to said filter input for directly controlling the center frequency of said filter by the control signal from the output of said receiver demodulator.

References Cited

UNITED STATES PATENTS

| | | | |
|---|---|---|---|
| 2,969,459 | 1/1961 | Hern | 325—344 |
| 2,976,408 | 3/1961 | Colaguori | 328—138 XR |
| 3,281,698 | 10/1966 | Rose, et al. | 325—477 XR |

ROBERT L. RICHARDSON, Primary Examiner

K. W. WEINSTEIN, Assistant Examiner

U.S. Cl. X.R.

325—344, 467, 477, 490; 328—138, 140; 329—139